(12) United States Patent
Schneider

(10) Patent No.: US 8,090,027 B2
(45) Date of Patent: Jan. 3, 2012

(54) DATA COMPRESSION USING AN ARBITRARY-SIZED DICTIONARY

(75) Inventor: James P. Schneider, Raleigh, NC (US)

(73) Assignee: Red Hat, Inc., Raleigh, NC (US)

( * ) Notice: Subject to any disclaimer, the term of this patent is extended or adjusted under 35 U.S.C. 154(b) by 1161 days.

(21) Appl. No.: 11/897,081

(22) Filed: Aug. 29, 2007

(65) Prior Publication Data

US 2009/0060047 A1      Mar. 5, 2009

(51) Int. Cl.
*H04N 7/12* (2006.01)
(52) U.S. Cl. .......... 375/240.23; 375/240.24; 375/240.25
(58) Field of Classification Search ............. 375/240.23, 375/240.24, 240.25
See application file for complete search history.

(56) References Cited

U.S. PATENT DOCUMENTS 5,155,484 A   10/1992   Chambers, IV

OTHER PUBLICATIONS

A Novel Collaborative Scheme of Test Data Compression Based on Fixed-Plus-variable-Length Coding; Wenfa Zhan; Huaguo Liang; Feng Shi; Zhengfeng Huang; Computer Supported Cooperative Work in Design, 2007. CSCWD 2007. 11th International Conference on ; Publication Year: 2007 , pp. 1044-1.*
The Construction of Variable Length Codes With Good Synchronization Properties; Higgs, M.B.J.; Perkins, S.; Smith, D.H.; Information Theory, IEEE Transactions on ; vol. 55 , Issue: 4 ; Publication Year: 2009 , pp. 1696-1700.*
Codec Design for Variable-Length to Fixed-Length Data Conversion for H.263; Chua-Chin Wang; Gang-Neng Sung; Jia-Hao Li; Intelligent Information Hiding and Multimedia Signal Processing, 2006. IIH-MSP '06. International Conference on Publication Year: 2006, pp. 483-486.*

* cited by examiner

*Primary Examiner* — David Y Jung
(74) *Attorney, Agent, or Firm* — Lowenstein Sandler PC

(57) ABSTRACT

A data compression method improves Lempel-Ziv ("LZ") compression by encoding the offsets produced during LZ compression as variable-bit-length ("VBL") encoded integers, and outputting the VBL integers as part of the compressed data. Other integers produced during LZ compression, as well as integers produced by other data compression algorithms, can also be encoded using a VBL scheme.

16 Claims, 7 Drawing Sheets

Fig. 3

Variable-Bit-Length Integer Encoding

| Decimal Equivalent | Fixed Bit Length Binary Encoding | Variable Bit Length Binary Encoding |
|---|---|---|
| 5 | 00000101 | 0 1 0 1 |
| 33 | 00100001 | 1 0 1 1 0 1 0 |
| 78,187,493,530 | 00010010 00110100 01010110 01111000 10011010 | 1 1 1 0 1 0 0 1 0001 0010 0011 0100<br>0101 0110 0111 1000<br>1001 1010 |

DATA COMPRESSION USING AN ARBITRARY-SIZED DICTIONARY

FIELD

The invention relates to lossless data compression. More specifically, the invention relates to methods for improving compression ratios (i.e. decreasing the size of compressed data relative to the data's uncompressed size).

BACKGROUND

Contemporary data processing activities often produce, manipulate, or consume large quantities of data. Storing and transferring this data can be a challenging undertaking. One approach that is frequently productive is to compress the data so that it consumes less space (and can be transmitted over a given communication channel more quickly). Data compression algorithms identify redundant or inefficiently-coded information in an input data stream and re-encode it to be smaller (i.e., to be represented by fewer bits). Various types of input data may have different characteristics, so that a compression algorithm that works well for one type of data may not achieve a comparable compression ratio when processing another type of data.

No known compression algorithm achieves the best results for every data type; there is always an input data stream that an algorithm simply cannot make any smaller, though there is often a different algorithm that could re-encode the same data stream in a smaller number of bits. Sometimes, an algorithm operates in a way that both compresses a data stream and exposes additional redundancy or inefficient coding, so that a second compression stage could shrink the information even further. The design of an effective, general-purpose data compressor often involves trade-offs between the compression ratio and the number of stages (more stages typically increase compression and decompression processing time).

Many compression algorithms produce integers as part of a compressed data stream. For example, in run-length encoding ("RLE") compression, repeated instances of a symbol may be replaced by a single copy of the symbol and an integer indicating how many times the symbol was repeated. From a theoretical perspective, the performance of an RLE compressor should be proportional to the lengths of repeated strings of symbols in the input. However, in a practical implementation on a digital computer, real-world considerations degrade the performance. For example, if lengths are represented as an eight-bit integer, then repeated sequences longer than 255 symbols must be broken into two or more runs of 255 or fewer symbols. The length limit can be increased by using 16-bit integers, but this "solution" has its own problems: now, runs shorter than 256 symbols waste eight bits of the "length" integer. (Furthermore, 16-bit integers have an upper limit at 65,535, so runs longer than that must also be broken up.)

Techniques for improving the handling of integers produced during a data compression process can increase the performance of that process.

BRIEF DESCRIPTION OF DRAWINGS

Embodiments of the invention are illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

FIG. 3 shows several examples of variable-bit-length encoding of integers.

DETAILED DESCRIPTION

An embodiment of the invention modifies a prior-art compression algorithm to use a variable-bit-length encoding for integers produced during compression. This permits the use of arbitrarily-large values for repeat counts, offsets and lengths, which may in turn improve compression performance. Even when the base data compression algorithm operates so that integers are bounded (i.e. they never exceed a known value), using variable-bit-length encoding for the integers can wring extra bits out of the compressed output stream.

Figure 1:
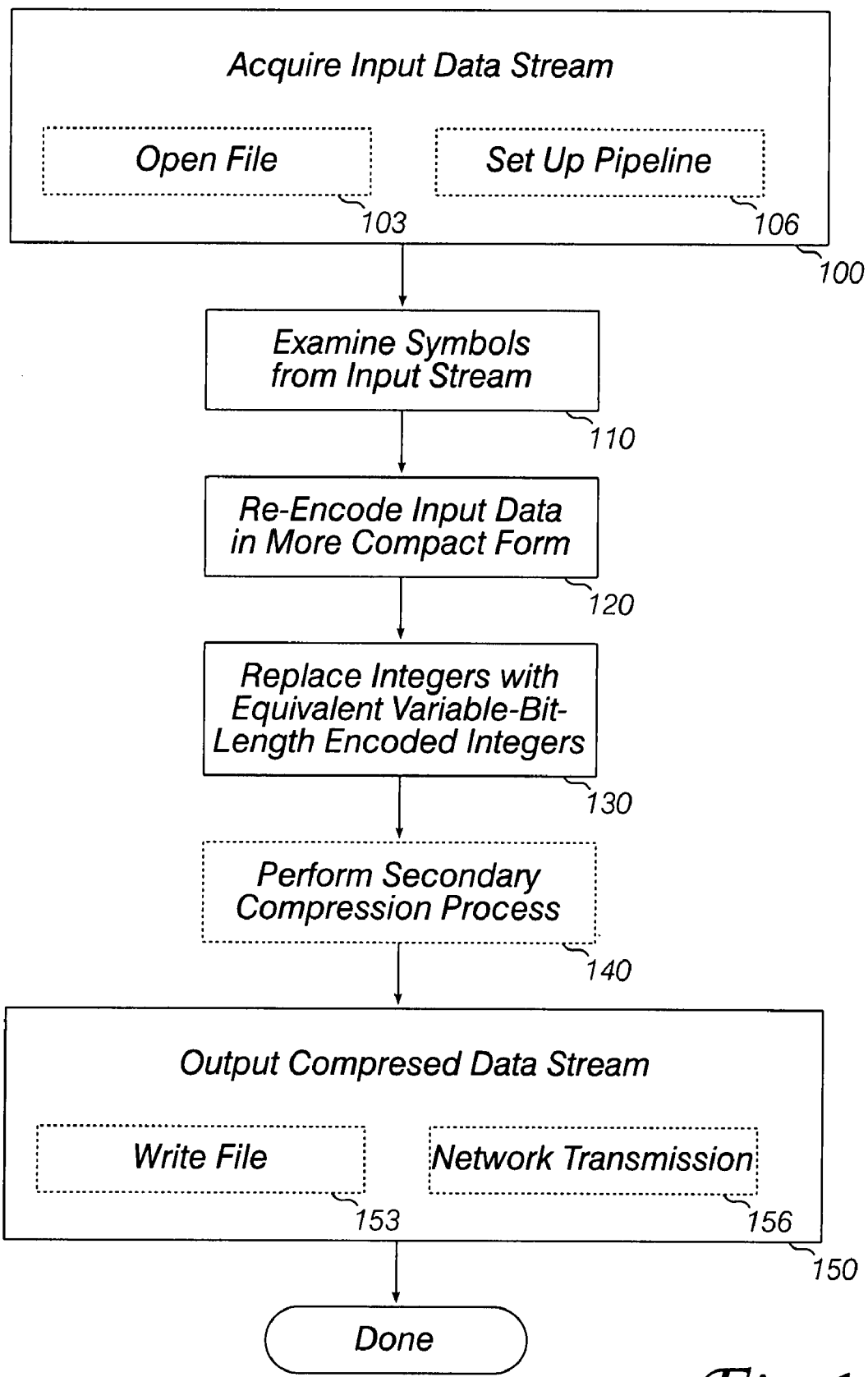
FIGS. 1 and 2 are high-level flow charts of compression and decompression operations according to an embodiment of the invention.

FIG. 1 is a flow chart showing how an embodiment of the invention can be incorporated into a prior-art data compression process. First, an input data stream is acquired (100). This may be done, for example, by opening a file (103) or setting up a pass-through data pipeline (106). Symbols (e.g., bytes) from the input data stream are examined (110) and the compression algorithm re-encodes the symbols in a more compact form (120). (As noted above, not all input data streams can be compressed. Sometimes, the best an algorithm can do is to avoid expanding the data stream.)

Integers in the compressed data stream, which may be represented as fixed-bit binary numbers, are replaced by equivalent, variable-bit-length encodings of the integers (130). The integers produced by several representative data compression algorithms, and methods for representing them in a variable bit length encoding, are described in greater detail below. Some or all of the re-encoded information from the compression algorithm (including the re-encoded, variable-bit-length integers) may be subjected to a second compression process (140). Finally, the compressed data stream is output (150). For example, the compressed data may be stored in a file (153) or transmitted over a communication link to another system (156), where it will be decompressed and processed.

Figure 2:
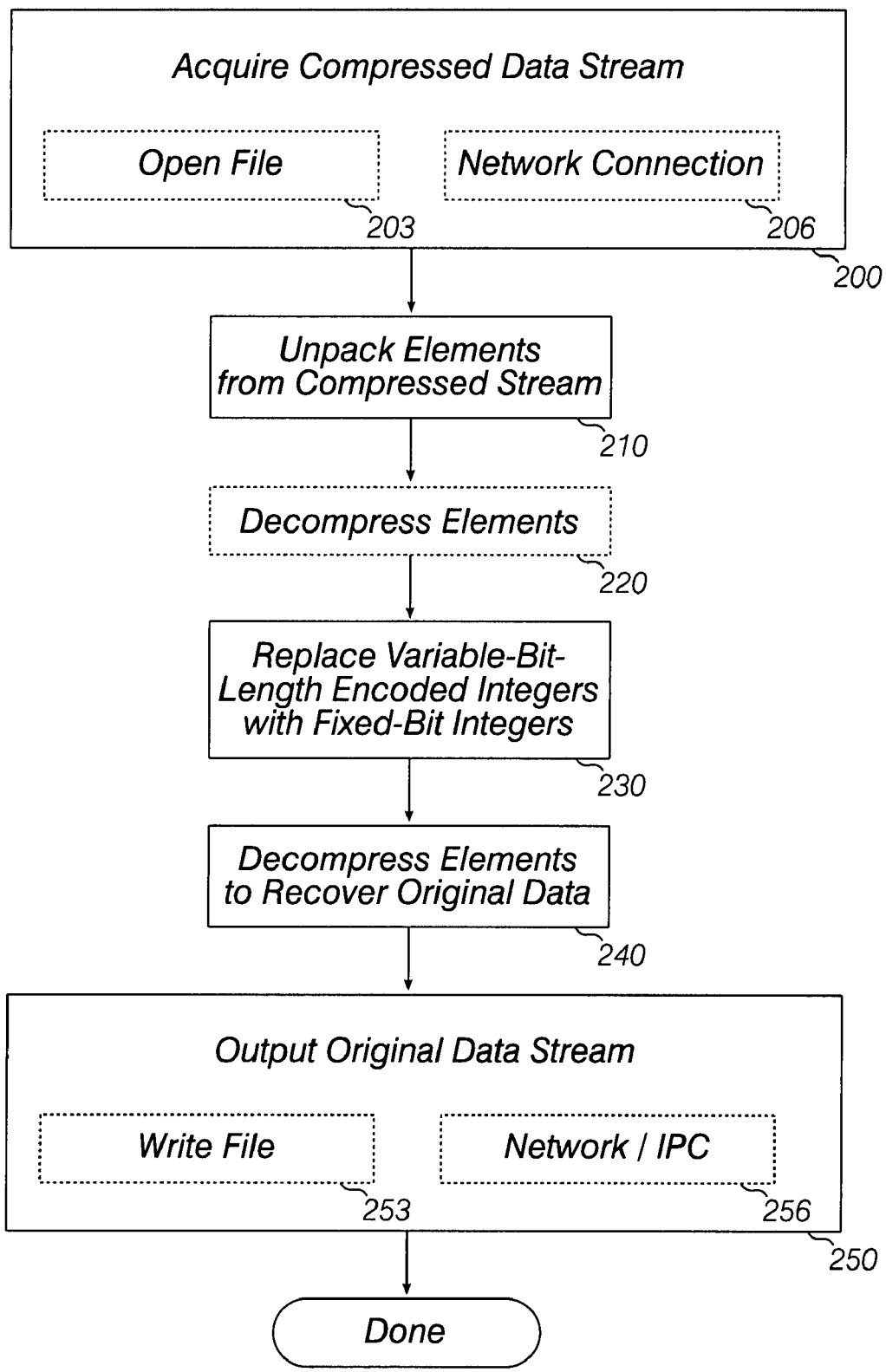

FIG. 2 shows the corresponding decompression process: a compressed data stream is acquired (200) by opening a compressed file (203) or establishing a network or interprocess connection to receive compressed data (206). Elements of the compressed data stream are unpacked (210). (Unlike most uncompressed data streams, compressed streams usually include items represented by varying numbers of bits. For example, a flag to indicate a condition of interest to the decompressor may occupy a single bit in the compressed stream, rather than a full eight-bit byte. Unpacking places these items into "containers" such as bytes, words or long words that can be manipulated more efficiently by a programmable processor.)

If the elements had been compressed by a second-phase (or subsequent-phase) compressor when the compressed stream was created, they are decompressed now (220). Elements representing integers (which are encoded using a variablebit-length encoding scheme according to an embodiment of the invention) are re-encoded into a fixed number of bits (230). The fixed number of bits is chosen to be adequate to represent the value without truncation, and to be efficiently manipulated by a programmable processor.

The re-encoded integers and other elements are supplied to a decompression algorithm, which reverses the encoding performed by the compression algorithm when the compressed stream was created (240). Finally, the original input data stream, having been recovered from the compressed data stream, is output (250). For example, the original data may be stored in a file (253) or passed to another process via a network or interprocess communication connection (256) for further manipulation.

Table 1 shows the relationship between several common sizes of binary numbers (in bits) and the range of decimal numbers that can be represented by that number of bits.

TABLE 1

| Number of Bits | Decimal (Signed) | Decimal (Unsigned) |
|---|---|---|
| 8 | −128~127 | 0~255 |
| 16 | −32,768~32,767 | 0~65,535 |
| 32 | $-2^{31}$~$2^{31}-1$ | 0~$2^{32}-1$ |

Note that every integer in any of those ranges, regardless of the integer's magnitude, occupies the same number of bits in a fixed-length encoding scheme. Thus, small integers such as zero or one, which could theoretically be represented in only a few bits, fill the same number of bits as an integer near the maximum of a range.

Programmable processors are often adapted to work most efficiently when processing data elements of one of a few different sizes (such as eight-bit bytes, 16-bit words, or 32-bit longs). Thus, if a developer knows that a certain value may exceed the range that can be represented by one of those sizes (or wishes to allow for that possibility), he must use the next-larger size. This is not normally a significant problem, but in the context of data compression (where the object is to represent a data stream with as few bits as possible), doubling the size of an element to accommodate a possible large value of the element can waste a great deal of space.

Consequently, embodiments of the invention use a variable-bit-length ("VBL") encoding to represent integers, thus trading improved space efficiency for increased processing required to convert a fixed-bit-length ("FBL") encoded integer to a variable-bit-length encoding during compression, and to perform the reverse conversion during decompression. FIG. 3 shows one way integers can be encoded using a variable number of bits. In this encoding scheme, an integer is represented by an ordered series of bits (shown left-to-right in most-significant-bit to least-significant-bit order). The encoded integer includes two logical parts: a prefix 310 that indicates how many bits are in the variable-length encoding, and the bits that encode the integer itself 320. In the prefix, the number of "1" bits before the first "0" bit indicates the number of bits of the integer (so a VBL-encoded integer uses at least one bit more to encode the integer than the minimum-length binary representation of the integer itself). Example integer 330 (decimal value 5) has no leading "1" bits in its prefix 333, so the next three bits 336 encode the integer. Any unsigned decimal number from zero (0) to seven (7) (or signed decimal number between −4 and 3) can be expressed in four (4) bits by this scheme. For numbers outside those ranges, a single leading "1" bit (followed by a "0" bit) indicates that the following five (5) bits encode the integer, which can be from eight (8) to thirty-nine (39). (Note that in this embodiment, the smallest possible coding for an integer is chosen. Thus, with a prefix of "10" indicating a five-bit integer, a value of zero in each of the five bits represents the first integer larger than the one that could be encoded with a prefix of "0.") Example integer 340 (decimal value 33) shows the "10" prefix 343 and five bits 346 that encode the integer. The correspondence between the number of leading "1" bits (prefix bits) in a variable-bit-length encoded integer and the number of bits in the encoded integer can be adjusted to obtain encodable ranges that fit the data well. For example, if a compression algorithm emits many integers with values in the range from zero to 15, the variable-bit-length encoding system may use a leading "0" bit to indicate four integer bits, rather than three (as described in the discussion of FIG. 3).

In some embodiments, the prefix itself may be divided into two parts, with a fixed first sequence (e.g. a leading "1110" sequence) indicating that the subsequent n bits (n standing for an appropriately-chosen integer) represent a "size" integer, which in turns represents the number of bits or bytes present in the representation of the integer to be expressed. This encoding may be used when extremely large integers are to be placed in an output stream. In FIG. 3, an example integer using this encoding is shown at 350: prefix "1110" (353) introduces the four-bit "size" prefix 355 (with a value of $0101_2$, or 6); the following five octets 356 contain the encoded integer with a decimal value of 78,187,493,530.

It is appreciated that the "prefix-and-integer" variable-length encoding scheme described above moves information in the compressed data stream around in a way that exposes additional opportunities for compression. Roughly speaking, the prefixes express the ranges of integers found in the compressed data stream, so if there are (for example) many integers in the 8-39 range, many "10" prefixes will be present in the compressed data stream with VBL integers, and an entropy-encoding compression algorithm such as adaptive Huffman coding or adaptive arithmetic coding may be able to compress the VBL integers even further.

Figure 4:
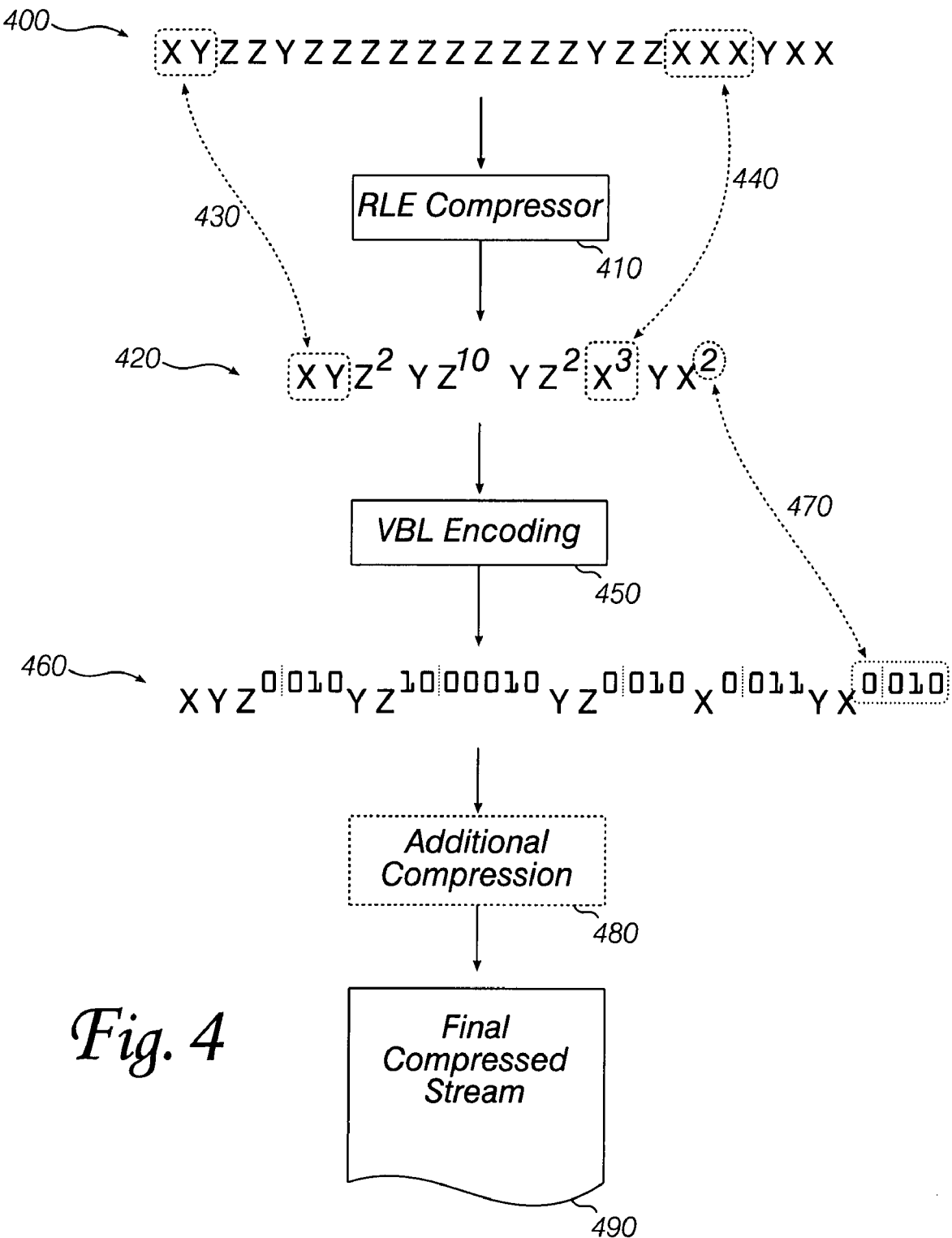
FIG. 4 depicts an embodiment of the invention used with a run-length encoding compression algorithm.

FIG. 4 illustrates a process of compressing a text string using run-length encoding ("RLE") according to an embodiment of the invention. The input stream 400 is a sequence of letters, with several runs of repeated letters. Run-length encoding process 410 produces a preliminary compressed data stream 420, including some characters 430 that are not repeated in input stream 400 and so appear verbatim in the preliminary compressed stream 420. Repeated characters are replaced with a single copy of the character and an integer expressing the number of times the character is to be repeated. Several instances of such replacement are shown in this example. Element 440 indicates one of these: three 'X' characters 440 are replaced by one 'X' and the integer 3.

The integers in the preliminary compressed stream 420 are re-encoded using a variable bit length encoding scheme 470 such as the one discussed in reference to FIG. 3. As a result, preliminary compressed stream 420 is re-encoded as shown at 460. Element 470 indicates the VBL re-encoding of the integer 2 as $1010_2$. On average, replacing the fixed-bit-length integers in preliminary compressed stream 420 with VBL integers will reduce the number of bits required to represent the compressed data stream. (Of course, certain pathological input streams having just the right number of repeated symbol sequences will be expanded when fixed integers are replaced by VBL integers.)

Finally, some or all of the VBL-integer compressed stream may be compressed again (480) to produce the final compressed stream 490. The final stream may be stored or transmitted elsewhere for further processing.

Figure 5:
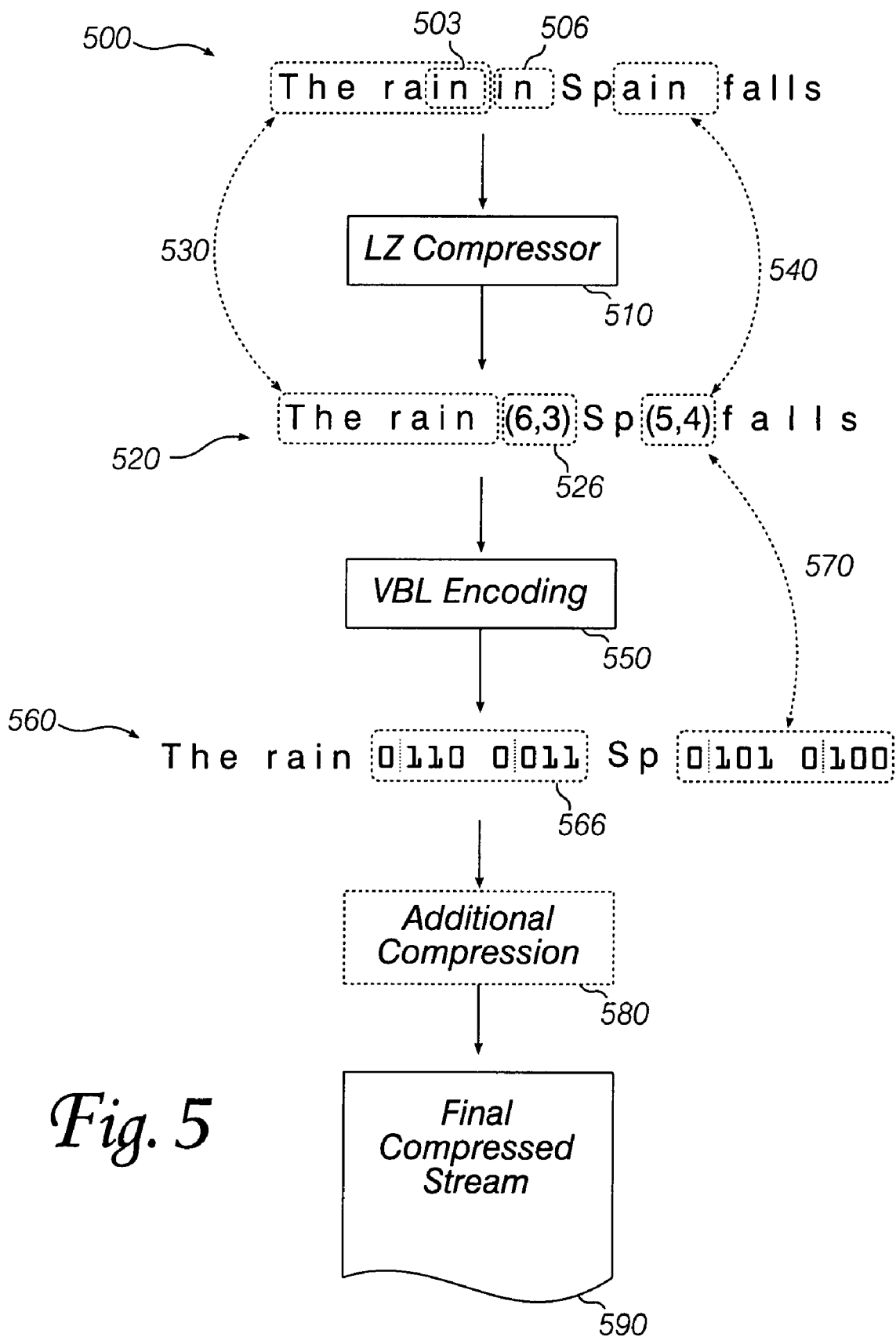
FIG. 5 depicts an embodiment of the invention used with a Lempel-Ziv compression algorithm.

FIG. 5 illustrates the application of an embodiment of the invention to a more sophisticated compression algorithm, Lempel-Ziv dictionary compression. As will be familiar to those of skill in the relevant arts, dictionary compressors work by matching sequences of characters in the input data with identical sequences in a dictionary, and then outputting information to allow the decompressor to locate the same sequence in its copy of the dictionary. If the information is smaller than the matching sequence, then the dictionary compressor will successfully compress the input data. There are two major variants of Lempel-Ziv ("LZ") compression, first described in papers published by Abraham Lempel and Jacob Ziv in 1977 and 1978. The algorithms are often referred to as "LZ77" and "LZ78," respectively. The following discussion is focused on the more popular LZ77 variant, but the application of an embodiment of the invention to the LZ78 variant requires only minor changes.

In LZ77 compression, the dictionary is built up from the input data itself, so its operations can be understood as locating repeated sequences of symbols in the input data stream and, for each sequence after the first, replacing the sequence with information to indicate where the first sequence occurred. This information can conveniently be represented as an integer offset from a known point in one of the data streams, and an integer length of the repeated sequence. FIG. 5 shows an LZ compressor 510 operating on an input text string 500 to produce the preliminary compressed stream 520. Input characters that have not been seen earlier in the input string are passed through the compressor as literals 530. Character sequences that have appeared previously are encoded as an offset and a length. In this example, the characters "in<space>" 506 are identical to the previously-encountered characters 503 at the end of the word "rain." Therefore, the characters at 506 are replaced by the offset/length pair 526 in preliminary compressed stream 520. Element 540 indicates a second replacement made during this processing. If there are multiple previous copies of a symbol sequence, it may be preferable for a compressor to emit the offset of the nearer occurrence, rather than the more distant occurrence. The reasons for this are discussed below.

Integers in the preliminary compressed data 520 are encoded using a variable bit length scheme in a process 550. In this example, the VBL-encoded stream 560 includes VBL integer pairs 566 and 570. Portions of the VBL-encoded stream 560 may be further compressed 580. For example, the literals may be compressed together, the offsets may be compressed together, and/or the lengths may be compressed together. Finally, the optionally-compressed portions of the VBL-integer compressed stream are output as a complete compressed stream 590 that contains all of the information in the input stream, expressed in a smaller number of bits.

Many variants of the basic LZ compression idea have been developed and will be familiar to those of skill in the relevant arts. Generally speaking, an LZ compressor will re-encode an input stream to replace a plurality of repeated sections with information to recreate each repeated section, the information including an offset of each repeated section and a length of each repeated section. These offsets and lengths are integers, which (according to an embodiment of the invention) are represented using a variable-bit-length encoding scheme such as that described in reference to FIG. 3.

In a conventional LZ compressor, the offset and length integers are expressed in a fixed number of bits, so both integers are limited to values that can be represented by those bits. For example, if the offset is a 12-bit integer, then a repeated sequence must appear within about 4,096 symbols of the previous occurrence, or the offset will not be able to indicate the previous location. Increasing the number of bits allocated to representing the offset increases the chance that a previous occurrence of a string can be identified and used for compression (in effect, it increases the size of the dictionary), but it also increases the number of bits used for every offset, even when those bits are not necessary to represent a smaller-magnitude integer. An embodiment of the invention allows the use of an arbitrarily-large dictionary since integers of any magnitude can be represented. Thus, instead of an inherent dictionary-size limitation imposed by the fixed number of bits allocated to offset and length integer representations, a dictionary compressor is limited only by the buffer space available to the compression algorithm. The compressor can find and encode repeated strings that occurred anywhere earlier in the input stream, so the dictionary could be as large as the input stream itself. The size of the input stream (or the largest offset encountered during compression) may be useful to set the size of the decompression buffer, so an embodiment of the invention may determine the size of the input stream and add it to the compressed data for the benefit of a subsequent decompressor. Of course, it is appreciated that the compressor may prefer to reference the most-recently-encountered instance of a repeated string, since that instance will be at a smaller offset, and the offset-identifying integer can be represented in a smaller number of bits with the variable-bit-length encoding scheme. Variable bit length encoding of offsets and lengths may improve compression performance even in LZ implementations that use a fixed size buffer, since a carefully-chosen VBL encoding scheme can often reduce the number of bits required to represent integers.

Figure 6:
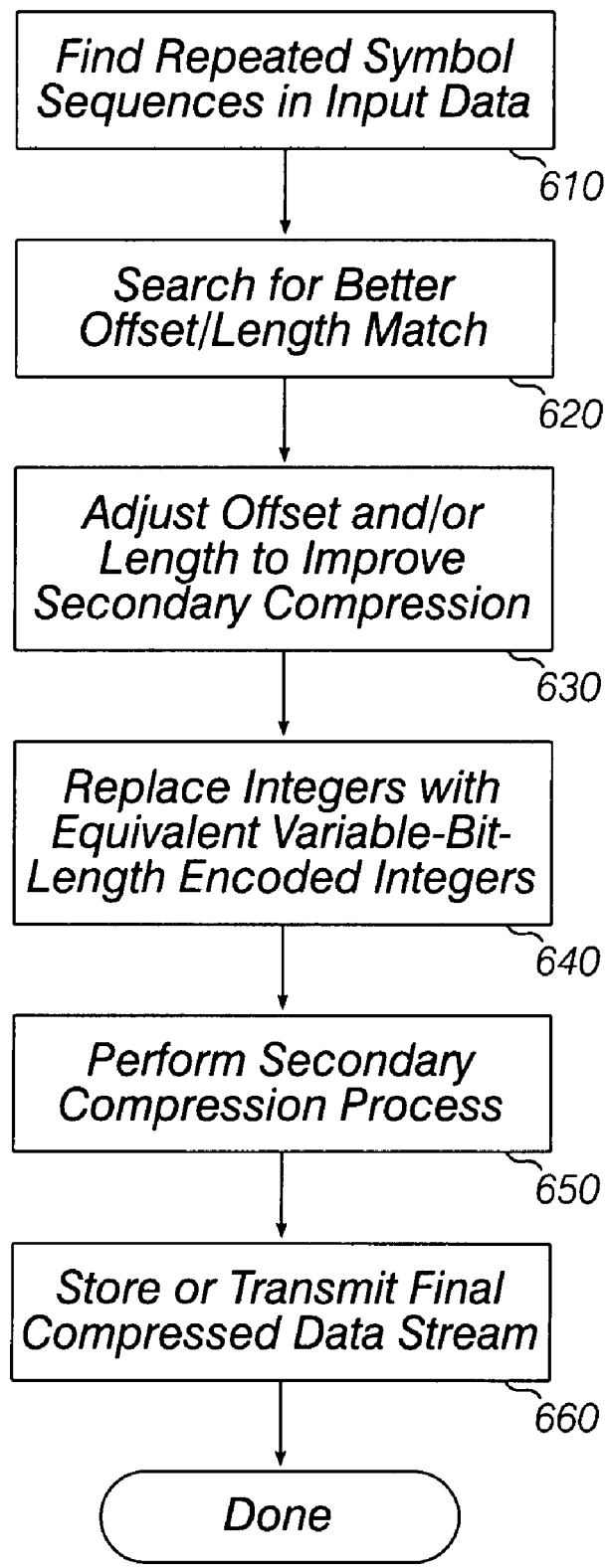
FIG. 6 is a flow chart of a further optimization of Lempel-Ziv compression when an embodiment of the invention is used.

FIG. 6 details a further improvement to an LZ compression process that may be beneficial when an embodiment of the invention is in use. As in conventional LZ compression, an input stream is processed to find repeated sequences of symbols (610). Repeated sequences are identified by an integer offset, usually either counting forward from the beginning of the input stream or from the current buffer; or counting backward from the current symbol. An integer length expresses the number of symbols in the repeated sequence. However, instead of emitting the first offset/length pair of a repeated sequence immediately, an embodiment may continue processing the input stream to find a better (i.e. longer) match nearby (620). For example, perhaps a four-character match starts at the current symbol, but a nine-character match starts two characters later. If the four-character match is emitted, then the input stream will have been processed past the start of the nine-character match, so this longer match and its attendant improved compression would be missed.

Now, the best offset and length pair may be adjusted with an eye to improving the secondary compression of the integer data (630). For example, if a previous match started at offset 134,721 with length 269, and the current match's offset is 134,720 with length 340, the current match may be adjusted to start at 134,721 with a length of 339, because a secondary compression of the offset integers can remove more bits from the output stream due to the repeated offset than are added to the output stream by starting the match one symbol later. Similarly, a match length alone may be reduced so that the length is the same as previously-detected matches, which may improve the compressibility of the lengths. Returning briefly to the example of FIG. 5, this processing may result in the adjustment of match 540 to have a start offset of six and a length of three, because previous match 526 also has the same offset and length.

Continuing with operations of an embodiment in FIG. 6, the possibly-adjusted integers are replaced with variable-bit-length encodings of the same integers (640), then a secondary compression process is applied to the VBL integers (650). The final compressed data stream is stored or transmitted elsewhere for further processing (660).

Figure 7:
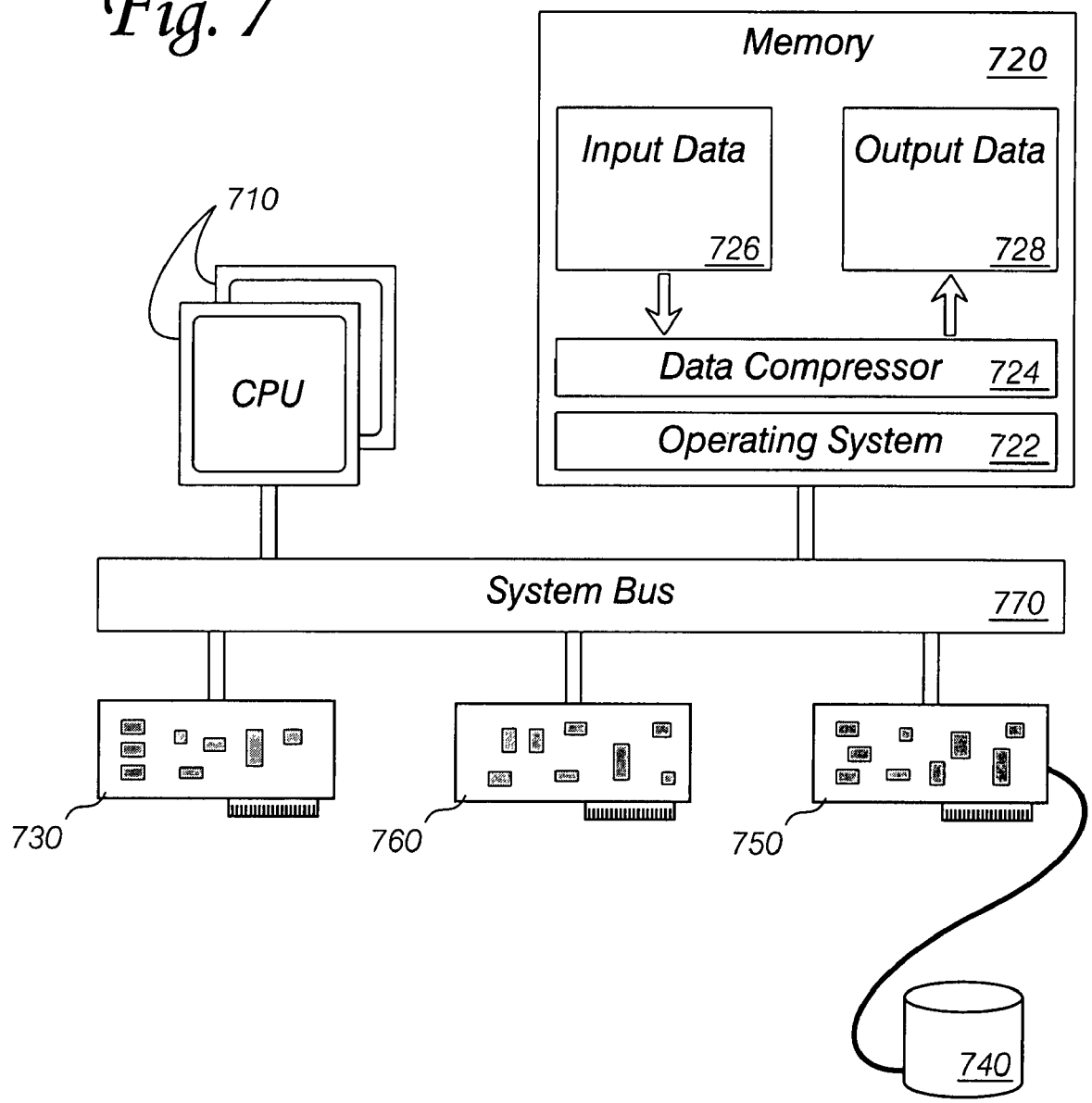
FIG. 7 shows some structures and subsystems of a computer containing an embodiment of the invention.

FIG. 7 shows some components and subsystems of a computer that contains an embodiment of the invention. One or more programmable processors (two central processing units or "CPUs," 710, shown here) execute according to data and instructions stored in a memory 720 to perform compression and decompression operations as described above. Memory 720 may contain data and instructions of several types: operating system 722 manages system resources and allocates them among concurrently-running processes; and data compressor 728 reads input data 726, processes it (either compressing or decompressing) to produce output data 728. The computer system may include a network interface 730 to communicate with other systems through a distributed data network such as the Internet (not shown), a display interface 760 to present information on a monitor (not shown), or a mass storage interface 750 to read and write data on a storage device 740. All the components of the system exchange data and control signals via a system bus 770.

Embodiments of the invention can be used with other existing (or after-developed) compression algorithms. Wherever integers are produced as part of a compressed representation, they may be replaced with variable-bit-length encoded integers. The benefit of this replacement depends in part on the ranges of integers produced by the particular compression algorithm. However, as noted above, the collection of information about integer ranges that occurs when VBL prefixes are added may provide additional opportunities for a secondary compression algorithm to remove redundant or inefficiently-coded information.

An embodiment of the invention may be a machine-readable medium having stored thereon data and instructions to cause a programmable processor to perform operations as described above. In other embodiments, the operations might be performed by specific hardware components that contain hardwired logic. Those operations might alternatively be performed by any combination of programmed computer components and custom hardware components.

Instructions for a programmable processor may be stored in a form that is directly executable by the processor ("object" or "executable" form), or the instructions may be stored in a human-readable text form called "source code" that can be automatically processed by a development tool commonly known as a "compiler" to produce executable code. Instructions may also be specified as a difference or "delta" from a predetermined version of a basic source code. The delta (also called a "patch") can be used to prepare instructions to implement an embodiment of the invention, starting with a commonly-available source code package that does not contain an embodiment.

In the preceding description, numerous details were set forth. It will be apparent, however, to one skilled in the art, that the present invention may be practiced without these specific details. In some instances, well-known structures and devices are shown in block diagram form, rather than in detail, in order to avoid obscuring the present invention.

Some portions of the detailed descriptions were presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the preceding discussion, it is appreciated that throughout the description, discussions utilizing terms such as "processing" or "computing" or "calculating" or "determining" or "displaying" or the like, refer to the action and processes of a computer system or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, compact disc read-only memory ("CD-ROM"), and magnetic-optical disks, read-only memories (ROMs), random access memories (RAMs), eraseable, programmable read-only memories ("EPROMs"), electrically-eraseable read-only memories ("EEPROMs"), magnetic or optical cards, or any type of media suitable for storing electronic instructions.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes a machine readable storage medium (e.g., read only memory ("ROM"), random access memory ("RAM"), magnetic disk storage media, optical storage media, flash memory devices, etc.), a machine readable transmission medium (electrical, optical, acoustical or other form of propagated signals (e.g., carrier waves, infrared signals, digital signals, etc.)), etc.

The applications of the present invention have been described largely by reference to specific examples and in terms of particular allocations of functionality to certain hardware and/or software components. However, those of skill in the art will recognize that variable-bit-length-encoded integers can also be added to compression algorithms by software and hardware that distribute the functions of embodiments of this invention differently than herein described. Such variations and implementations are understood to be captured according to the following claims.

I claim:

1. A method comprising:
performing Lempel-Ziv ("LZ") compression of input data to produce compressed data including offsets that are represented as fixed-bit-length (FBL) encoded integers, to produce literals and to produce lengths;
encoding the offsets from the FBL encoded integers into variable-bit-length (VBL) encoded integers using a VBL integer encoding scheme, wherein the encoding comprises, for each offset, determining a number of bits to use for a VBL encoded integer and generating a prefix for the VBL encoded integer that indicates the number of bits; and
outputting the compressed data with the encoded offsets.

2. The method of claim 1, further comprising:
encoding the lengths using the variable-bit-length integer encoding scheme.

3. The method of claim 1, further comprising:
compressing the encoded offsets using a second compression algorithm before outputting the compressed data with the encoded offsets.

4. The method of claim 1, further comprising:
compressing the literals, encoded offsets and lengths before outputting the compressed data.

5. The method of claim 1, wherein a number of leading "1" bits preceding a most-significant "0" bit in the prefix indicates a number of succeeding bits of the converted integer.

6. The method of claim 1, further comprising:
reducing an offset to be equal to a previously-produced offset.

7. The method of claim 1, further comprising:
reducing a length to be equal to a previously-produced length.

8. A computer-readable storage medium containing data and instructions to cause a programmable processor to perform operations comprising:
processing a compressed data stream to extract an integer value, the integer value encoded using a variable-length bit encoding scheme;
examining an ordered series of bits of the integer value encoded using the variable-length bit encoding scheme;
determining a number of bits of the ordered series of bits that represent the integer value based on a prefix included in the ordered series of bits;
re-encoding the integer value in a fixed number of bits;
locating a portion of a processed output stream at an offset specified by the integer value using a Lempel-Ziv ("LZ") compression algorithm; and
copying data from the portion to a tail end of the processed output stream.

9. The computer-readable storage medium of claim 8, containing additional data and instructions to cause the programmable processor to perform operations comprising:
buffering a predetermined number of bytes of the processed output stream, the predetermined number of bytes at least equal to a largest offset specified by an integer value extracted from the compressed data stream.

10. The computer-readable storage medium of claim 8 wherein the integer value represents an offset measured from a beginning of the processed output stream.

11. The computer-readable storage medium of claim 8 wherein the integer value represents an offset measured from the tail end of the processed output stream.

12. The computer-readable storage medium of claim 8, wherein
determining a number of bits of the ordered series of bits that represent the integer value based on the prefix comprises determining the number of bits in the ordered series of bits based on a number of most-significant "1" bits included in the prefix
re-encoding the integer in a fixed number of bits.

13. A system comprising:
a memory to store instructions and input data;
a mass storage device; and
a programmable processor to execute the instructions, wherein the instructions are to cause the programmable processor to perform operations comprising:
examining the input data to identify a first repeated section that is a copy of an original section;
replacing the first repeated section with an integer offset of the first repeated section and an integer length of the first repeated section using a Lempel-Ziv ("LZ") compression algorithm, wherein the integer offset and the integer length are represented as fixed-bit-length ("FBL") encoded integers;
encoding the integer offset and the integer length from the FBL encoded integers into variable-bit-length ("VBL") integers, wherein the encoding comprises, for each integer offset and each integer length, determining a number of bits to use for a VBL encoded integer and generating a prefix for the VBL encoded integer that indicates the number of bits;
compressing the VBL offset and VBL length; and
storing the compressed VBL offset and the compressed VBL length in a file on the mass storage device.

14. A computer readable storage medium including instructions that, when executed by a processing device, cause the processing device to perform a method comprising:
performing Lempel-Ziv ("LZ") compression of input data to produce compressed data including offsets that are represented as fixed-bit-length (FBL) encoded integers, to produce literals and to produce lengths;
encoding the offsets from the FBL encoded integers into variable-bit-length (VBL) encoded integers using a VBL integer encoding scheme, wherein the encoding comprises, for each offset, determining a number of bits to use for a VBL encoded integer and generating a prefix for the VBL encoded integer that indicates the number of bits; and
outputting the compressed data with the encoded offsets.

15. The computer readable storage medium of claim 14, the method further comprising:
encoding the lengths using the variable-bit-length integer encoding scheme.

16. The computer readable storage medium of claim 14, the method further comprising:
compressing the encoded offsets using a second compression algorithm before outputting the compressed data with the encoded offsets.

* * * * *